United States Patent [19]
Evans et al.

[11] 4,380,357
[45] Apr. 19, 1983

[54] SYSTEM AND METHOD FOR EFFECTING ELECTRICAL INTERCONNECTIONS USING A FLEXIBLE MEDIA WITH RADIALLY EXTENDING ELECTRICAL CONDUCTORS

[75] Inventors: Doyle R. Evans; Richard E. Tuthill, both of Lubbock, Tex.

[73] Assignee: Texas Instruments Incorporated, Dallas, Tex.

[21] Appl. No.: 203,020

[22] Filed: Nov. 3, 1980

[51] Int. Cl.³ .............................................. H01R 9/09
[52] U.S. Cl. ................................ 339/17 CF; 29/832; 339/59 M; 339/DIG. 3
[58] Field of Search .............. 339/17 F, 17 CF, 17 M, 339/59 M, 61 M, DIG. 3; 29/832, 834

[56] References Cited

U.S. PATENT DOCUMENTS

| | | | |
|---|---|---|---|
| 3,192,307 | 6/1965 | Lazar | 339/17 CF |
| 3,700,788 | 10/1972 | Spurck | 339/17 CF |
| 3,826,984 | 7/1974 | Epple | 324/158 F |
| 3,991,463 | 11/1976 | Squitieri et al. | 339/59 M |
| 4,255,003 | 3/1981 | Berg | 339/61 M |

FOREIGN PATENT DOCUMENTS 2056193 8/1971 Fed. Rep. of Germany ... 339/17 CF

OTHER PUBLICATIONS

Sid International Symposium Digest of Technical Papers, Chicago, IL, L. S. Buchoff, pp. 64, 65; 5-1979.

Primary Examiner—Neil Abrams
Attorney, Agent, or Firm—Robert D. Marshall, Jr.; Leo N. Heiting; Melvin Sharp

[57] ABSTRACT

A flexible media having a plurality of electrical conductors extending radially outward from a central portion thereof with insulative material interposed between adjacent conductors. Radially inward portions of selected ones of the conductors are placed in contact with respective ones of a first set of electrical components disposed in a first predetermined pattern and radially outward portions of the selected conductors are placed in contact with respective ones of a second set of electrical components disposed in a second predetermined pattern, the second set of components being spaced farther apart than the first set of components. In one embodiment the media is comprised of a circular elastomer material having electrical conductors disposed at equal angular intervals over the circumference of the material. The first set of electrical components is comprised of a plurality of electrical bond pads arranged in a circular pattern on a major surface of an electronic device, such as an integrated circuit chip, and the second set of components is comprised of a plurality of printed circuit conductors disposed on an insulative substrate, which extend radially inward toward the bond pads. In another aspect of the invention, the printed circuit conductors are formed directly on an inner major surface of an insulative casing, within which the primary components of an electronic apparatus are contained, thereby eliminating the need for a separate printed circuit board component.

25 Claims, 4 Drawing Figures

SYSTEM AND METHOD FOR EFFECTING ELECTRICAL INTERCONNECTIONS USING A FLEXIBLE MEDIA WITH RADIALLY EXTENDING ELECTRICAL CONDUCTORS

BACKGROUND OF THE INVENTION

This invention relates to electronic devices and systems and, in particular, to a system and method for electrically interconnecting electronic components in an electronic system.

Various processes are known in the art for electrically coupling an electronic device, such as an integrated circuit formed on a single semiconductor chip, to an external electronic component or system. Such processes typically involve mounting the device on an insulative substrate having a plurality of electrical conductors; electrically coupling bond pads mounted on the device to the substrate conductors; molding a protective plastic casing around the device; trimming and forming electrical leads emanating from the plastic casing to form a desired package; and soldering the electrical leads to printed circuit conductors on a printed circuit board in an electronic apparatus.

A common device package is the so-called "dual in line" package (DIP) wherein the electronic device is encapsulated and sealed within a molded plastic casing. The process of manufacturing DIP's is comprised of the steps of affixing the electronic device to a central mounting pad in a metal lead frame; coupling the bond pads located on the perimeter of the device to the leads of the lead frame using fine gold wires or ultrasonic bonding; encapsulating the device and lead frame in a plastic casing by an injection or transfer molding process; and trimming and forming the electrical leads of the lead frame to the desired length and configuration. The electrical leads can be bent or otherwise shaped to provide the necessary "plug-in" connection to a printed circuit board or the like.

Conventional assembly and packaging techniques have several disadvantages, however. First, interconnection and packaging techniques are relatively complex and involve several different steps. Second, expensive positioning equipment is needed to precisely align the bond pads of an electronic device, which have one particular geometry and configuration, with the respective electrical conductors, which usually have a significantly different geometry and configuration from that of the bond pads, to effect proper electrical interconnection. Further, relatively expensive bonding materials such as, for example, gold wires, are needed and time-consuming soldering operations are required.

SUMMARY OF THE INVENTION

It is therefore one object of the invention to provide an improved system and method for interconnecting electronic components.

It is another object of the invention to reduce the cost and complexity of interconnecting electronic components.

It is yet another object of the invention to provide a system and method for effectively connecting a plurality of bond pads on an electronic device with a plurality of printed circuit conductors disposed on an insulative substrate without the need for precise alignment therebetween.

It is still another object of the invention to provide a system and method for electrically interconnecting an electronic device to a plurality of external electrical components without wire-bonding and soldering operations.

It is a further object of the invention to provide an improved system and method for electrically interconnecting a first set of electrical components with a second set of electrical components which have substantially larger dimensions and are spaced substantially farther apart than the first set of electrical components.

It is still a further object of the invention to eliminate the need to encapsulate a semiconductor device in plastic.

These and other objects are accomplished in accordance with the present invention wherein first and second sets of electrical components disposed in respective first and second predetermined patterns are electrically interconnected by means of a flexible media having a plurality of electrical conductors extending radially outward from a central portion thereof with insulative material interposed between adjacent conductors. The second set of components is spaced farther apart than the first set of components. Radially inward portions of selected ones of the electrical conductors are positioned in contact with respective ones of the first set of electrical components and radially outward portions of the conductors, which are substantially wider than the inward portions, are positioned in contact with respective ones of the second set of electrical components.

In one embodiment the flexible media is a circular elastomer material having conductors spaced at equal intervals over the circumference thereof. The first set of electrical components is comprised of a plurality of electrical bond pads disposed in a circular pattern on a major surface of a semiconductor device, such as an integrated circuit, and spaced apart at equal intervals at a predetermined radial distance from the geometric center of the device. The second set of electrical components is comprised of a plurality of printed circuit conductors disposed on an insulative substrate, the conductors extending radially inward toward respective bond pads. The semiconductor device is positioned so that the bond pads are substantially in radial alignment with respective printed circuit conductors. The central portion of the elastomer material is placed in registration with the geometric center of the major surface of the semiconductor device so that radially inward portions of the electrical conductors are in contact with the bond pads and radially outward portions of the electrical conductors are in contact with the printed circuit conductors. The elastomer material is preferably of greater dimensions than the semiconductor device to provide a protective covering therefor when the elastomer material is positioned in contact with the electronic device. To maintain the elastomer material at a fixed position with respect to the bond pads and printed circuit conductors, biasing pressure is exerted on the flexible media.

In another embodiment the bond pads are positioned along the circumference of a circle at a radial distance of approximately 60 mils from the geometric center of the device and are each approximately 5 mils wide. The printed circuit conductors, on the other hand, are approximately 15 mils wide with approximately 15 mils between adjacent conductors. The electrical conductors on the elastomer material are each approximately 2 mils wide at a radial distance of 60 mils from the geometric center of the material and are substantially wider than 2 mils at the perimeter of the material. When the geometric center of the elastomer material is placed in registration with the geometric center of the semiconductor device, the 2 mil-wide portions of the electrical conductors will be in contact with respective electrical bond pads and radially outward portions of the conductors, which are substantially wider than 2 mils, will be in contact with the printed circuit conductors.

In another aspect of the invention, an electronic apparatus is provided having an insulative casing which houses the electrical components of the apparatus. The apparatus includes an electronic device having a plurality of electrical bond pads disposed in respective first and second predetermined patterns on a major surface thereof and a plurality of printed circuit conductors disposed directly on an inner major surface of the insulative casing and extending radially inward toward respective bond pads. The printed circuit conductors are spaced substantially farther apart than the bond pads. A flexible media having a plurality of electrical conductors disposed on a major surface thereof is provided. The major surface of the media is placed in contact with the major surface of the device so that corresponding first portions of the electrical conductors are in contact with the bond pads and corresponding second portions of the electrical conductors are in contact with the printed circuit conductors. In one embodiment the flexible media has radially extending electrical conductors formed on the major surface of the media. Radially inward portions of the conductors are in contact with the bond pads and radially outward portions of the conductors are in contact with the printed circuit conductors. The apparatus further includes at least one electrical component, such as, for example, a calculator keyboard or display, coupled to selected ones of the printed circuit conductors. In another embodiment the bond pads are disposed in a circular pattern on the electronic device and the printed circuit conductors are in radial alignment with respective ones of the bond pads.

In yet another embodiment the inner major surface of the insulative casing on which the printed circuit conductors are disposed has a recess formed therein for receiving the first electronic device. When the first electronic device is positioned in the recess, the bond pads are accessible via the mouth of the recess and are substantially in the same plane as the printed circuit conductors, thereby facilitating electrical interconnection. In still another embodiment an inner major surface of the insulative casing oppositely positioned from the inner major surface on which the printed circuit conductors are disposed includes biasing means for exerting downward biasing pressure on the media to maintain the media in a fixed position with respect to the bond pads and printed circuit conductors.

An advantage of the present invention is that precise alignment is not required to interconnect a first set of electrical components, such as, for example, the bond pads of an integrated circuit chip, with a second set of electrical components, such as, for example, a plurality of printed circuit conductors, thereby eliminating the need for expensive positioning equipment. For example, the bond pads of a typical integrated circuit chip are approximately 5 mils wide with approximately 5 mils spacing between adjacent bond pads. On the other hand, the printed circuit conductors of a printed circuit board or lead frame are typically on the order of 15 mils wide with approximately 15 mils between adjacent conductors. Radially inward portions of the electrical conductors of the flexible media are configured to match the geometry and configuration of the bond pads and radially outward portions of the conductors, which are wider than the inward portions, are configured to match the geometry and configuration of the printed circuit conductors. Also, wire-bonding, which includes soldering operations, and plastic encapsulation steps are not required to effect electrical interconnection, thereby simplifying and reducing the cost of the assembly process. The elimination of soldering operations provides a further cost reduction, because printed conductors can be formed directly on an insulative casing of an electronic apparatus, such as, for example, an electronic calculator casing, so that a separate printed circuit board component is not needed.

BRIEF DESCRIPTION OF THE DRAWINGS

Still further objects and advantages of the invention will be apparent from the Detailed Description and claims when read in conjunction with the accompanying drawings wherein:

DETAILED DESCRIPTION OF A PREFERRED EMBODIMENT

Figure 1:
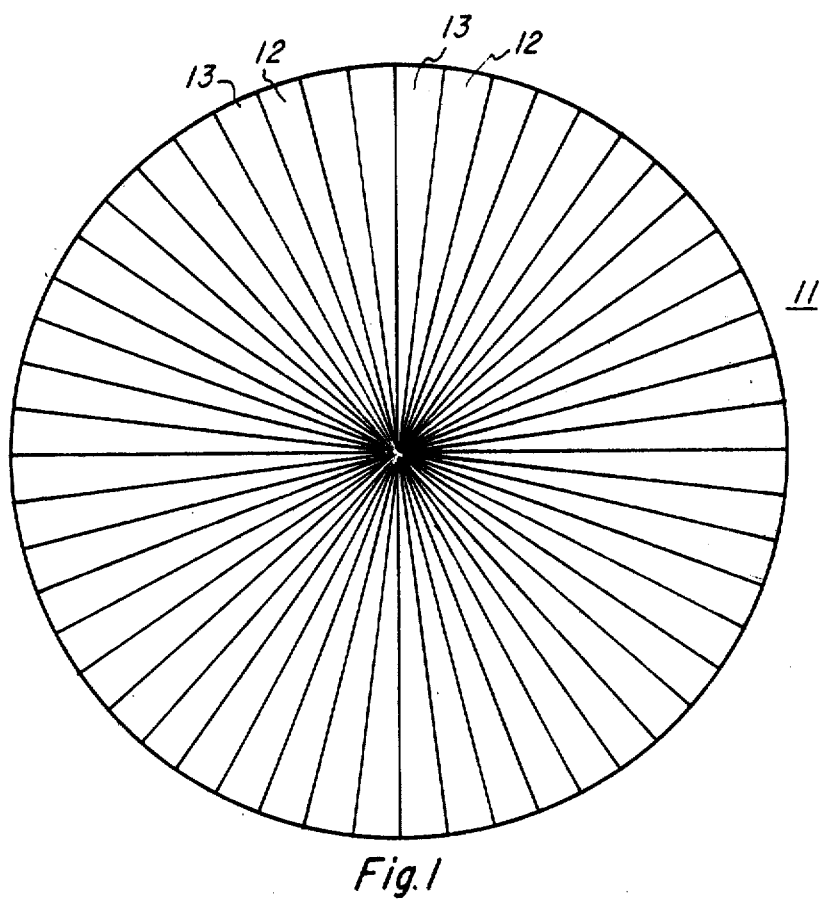
FIG. 1 is an elevational view of a circular electrical connector device of the present invention having radially extending electrical conductors thereon.

Referring to FIG. 1, a circular electrical connector device 11 is shown. Connector device 11 is preferably comprised of an elastomer based material with a plurality of electrical conductors 12 extending radially outward from the central portion of a major surface of connector device 11 and strips of insulative material 13 interposed between adjacent conductors 12 to provide a "zebra strip" configuration. Electrical conductors 12 and insulative strips 13 are wedge-shaped numbers, which increase in width in a direction radially outward from the central portion of connector device 11 and are spaced apart at equal angular intervals over the circumference thereof. The size of connector device 11 and the configuration and geometry of electrical conductors 12 are chosen to match the corresponding configurations and geometries of the electrical components being interconnected.

Figure 2:
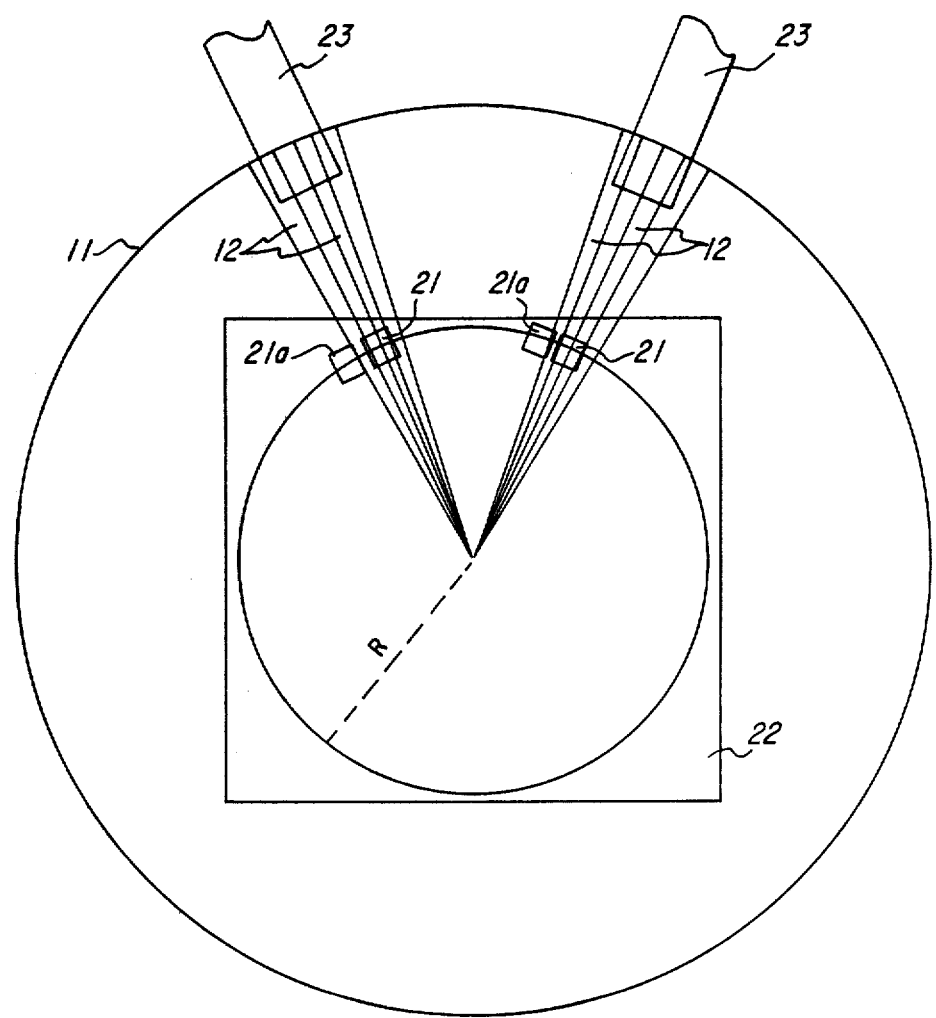
FIG. 2 is a top perspective view of the connector device of FIG. 1 positioned in contact with electrical bond pads of a semiconductor chip and printed circuit conductors on an insulative substrate to effect electrical interconnection therebetween.

Referring to FIG. 2, connector device 11 is depicted in contact with a plurality of electrical bond pads 21 arranged in a circular pattern on a major surface of a semiconductor device 22, such as, for example, an integrated circuit chip, and a plurality of printed circuit conductors 23 disposed on an insulative substrate and extending radially inward toward respective bond pads 21 to electrically interconnect device 22 with conductors 23. Printed circuit conductors 23 are electrically coupled to an external electronic component, such as, for example, a calculator keyboard or display, so that semiconductor device 22 is also electrically coupled to the external component. Device 22 is oriented with respect to printed circuit conductors 23 so that bond pads 21 are substantially in radial alignment with respective ones of conductors 23. Because of the redundancy of the conductive pattern on connector device 11, precise alignment between bond pads 21 and printed circuit conductors 23 is not required. The major surface of connector device 11 on which electrical conductors 12 are disposed is placed in contact with the major surface of device 22 on which bond pads 21 are disposed, with the central portion of connector device 11 in registration with the geometric center of semiconductor device 22. Radially inward portions of electrical conductors 12 engage bond pads 21 and radially outward portions of electrical conductors 12, which are substantially wider than the inward portions, engage printed circuit conductors 23.

Connector device 11 is particularly well-suited to interconnecting a plurality of electrical bond pads 21 with a plurality of printed circuit conductors 23, which are typically much larger than and spaced much farther apart than bond pads 21. For example, the minimum acceptable width of printed circuit conductors 23 for high volume, high yield commercial applications is 10 mils, with 10 mils spacing between adjacent conductors 23. It is preferable, however, for conductors 23 to be at least 15 mils wide, with 15 mils between adjacent conductors 23. On the other hand, a typical width of bond pads 21 is on the order of 5 mils or less, with a spacing on the order of 5 mils between adjacent bond pads 21. The width of bond pads 21 depends, of course, upon the size of semiconductor device 22 and the total number of bond pads 21 disposed thereon. The configuration of electrical conductors 12 is chosen so that radially inward portions of conductors 12 conform to the widths and spacings of bond pads 21 and radially outward portions of conductors 12 conform to the widths and spacings of printed circuit conductors 23.

Because the spacing of bond pads 21 need not conform to that of printed circuit conductors 23, as required when a linear conductive pattern is used, larger numbers of bond pads 21 can be included within a given area of a semiconductor chip. Furthermore, the circular conductive pattern on connector device 11 provides omni-directional electrical interconnections and performs the function of four connector devices having linear conductive patterns, because a separate linear connector device is required for each of the four sides of semiconductor device 22. For example, a typical integrated circuit chip having an area of 21,000 square mils (i.e. 145 mils on each side) can accommodate up to 7 bond pads on each side, when the bond pads are each 5 mils wide and spaced 15 mils apart in a parallel or linear pattern to conform to the typical 15 mils spacing between printed circuit conductors, also arranged in a parallel or linear pattern. Thus, only 28 bond pads can be included on the chip. Where greater numbers of bond pads are desired, the size of the chip must be increased. If, however, the bond pads are arranged along a circumference of a circle of radius R and the printed circuit conductors are disposed in a circular pattern around the perimeter of the chip, greater numbers of bonds pads can be accomodated. For example, assuming the same semiconductor chip area of 21,000 square mils, with the bond pads positioned along a circular arc having a circumference of 377 mils (R=60 mils) a total of 28 bond pads, each of which is 5 mils wide, accounts for 140 mils of the circumference, leaving a clearance of 237 mils. If the bond pads are spaced equally apart, the spacing between adjacent bond pads would be approximately 8.5 mils. If it is desired to double the number of bond pads so that 56 bond pads are disposed on the chip, each bond pad and adjacent spacing occupies 377/56 or 6.73 mils of the circumference. This could be accomplished by decreasing the size of each bond pad and adjacent spacing to approximately 3.35 mils each.

In FIG. 2, each printed circuit conductor 23 and corresponding bond pad 21 is connected to the same respective group of two electrical conductors 12. If the width of each bond pad is 5 mils, this could be accomplished by making each of electrical conductors 12 approximately 2 mils wide at a radius of 60 mils from the center of connector device 11. This equates to an angular interval of approximately $2\pi/60$ radians or 2°. At the outer edge of connector device 11 where radially outward portions of conductors 12 contact printed circuit conductors 23 (i.e. 110–120 mils from the center of semiconductor device 22), electrical conductors 12 are each on the order of 4 mils wide. This configuration is compatible for a wide range of semiconductor chips having substantially different numbers of bond pads, including the 28 and 56 bond pad configurations described above and with typical geometries and configurations of printed circuit conductors. Conductor widths of 2 mils with 2 mils of insulative material between adjacent conductors are readily achievable with current elastomer technology.

Furthermore, the use of a circular configuration makes precise alignment between bond pads 21 and printed circuit conductors 23 unnecessary. For example, in FIG. 2, assuming a bond pad width of 5 mils and a spacing of 8.5 mils between adjacent bond pads 21, bond pads 21 can be offset by approximately 5 mils from the position of precise radial alignment with respect to printed circuit conductors 23 without degrading the electrical connections. This is equivalent to rotating bond pads 21 by approximately 5° to new positions 21a.

Figure 3:
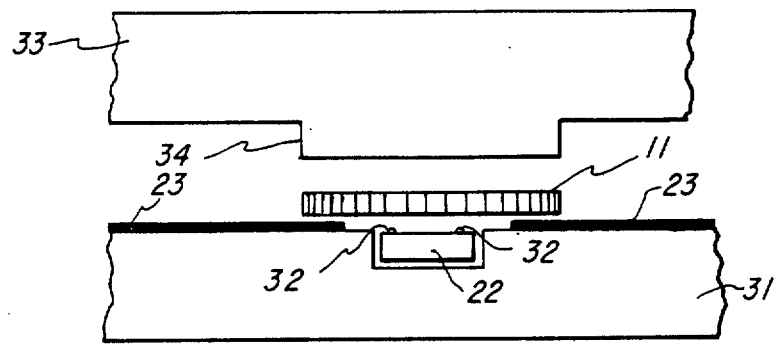
FIG. 3 is a cross-sectional view of an electronic apparatus showing the connector device being positioned to electrically interconnect a semiconductor chip and a plurality of printed circuit conductors disposed directly on an inner major surface of an insulative casing of the apparatus.

Referring to FIG. 3, semiconductor device 22 is disposed within a recessed portion of a first insulative casing member 31, such as, for example, the bottom portion of a calculator casing. Printed circuit conductors 23 are disposed directly on a major surface of casing member 31. Bond pads 21 are substantially in the same plane as printed circuit conductors 23 and gold bumps 32 are formed above each bond pad 21 on semiconductor device 22 to facilitate electrical interconnection between semiconductor device 22 and printed circuit conductors 23. The central portion of connector device 11 is placed in registration with the center of semiconductor device 22 so that radially inward portions of electrical conductors 12 are in contact with the gold-bumped bond pads 21 and radially outward portions of conductors 12 are in contact with printed circuit conductors 23. A second insulative casing member 33 includes a pressure foot 34, which exerts downward biasing pressure on connector device 11 to hold it in a fixed position with respect to bond pads 21 and conductors 23. Connector device 11 substantially envelops semiconductor device 22 to provide a protective covering therefor and eliminate the need for a separate printed circuit component.

Figure 4:
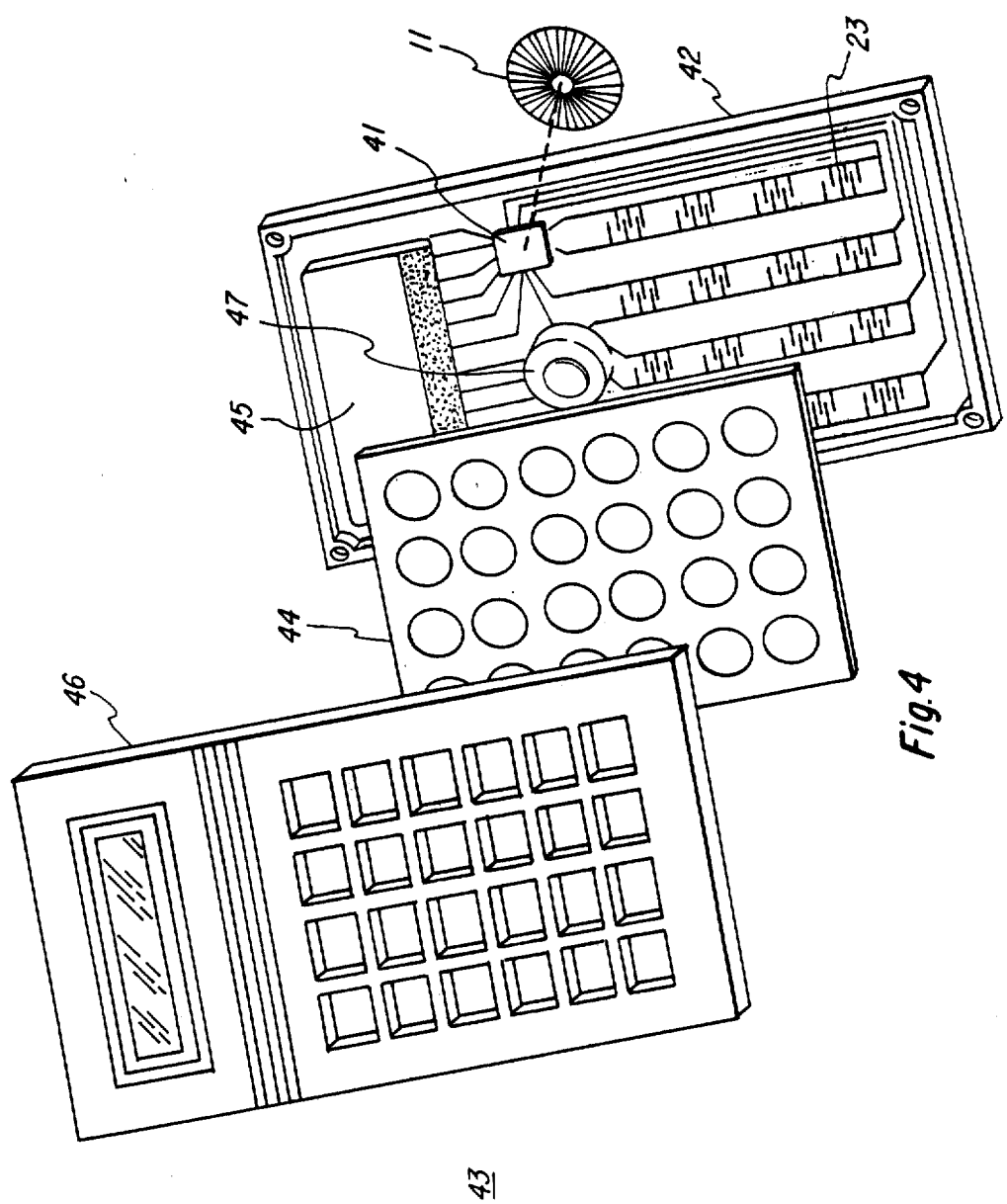
FIG. 4 is a perspective view of an electronic calculator in which the connector device is used to electrically connect the primary electronic components of a calculator, including an integrated circuit chip, keyboard and display.

Referring to FIG. 4, an integrated circuit chip 41 is shown mounted within a recessed portion of bottom casing 42 in an electronic calculator 43. Printed circuit conductors 23 are formed directly on an inner major surface of bottom casing 42 and are electrically coupled to an electronic keyboard 44 and display 45, such as a liquid crystal display. Circular connector device 11 is placed in registration with chip 41 so that electrical conductors 12 of device 11 are in contact with the electrical bond pads of chip 41 and with printed circuit conductors 23 to electrically interconnect chip 41 with keyboard 44 and display 45. Top casing 46 of electronic calculator 43 includes a pressure foot (see FIG. 3) for exerting downward biasing pressure on connector device 11 when top and bottom casings 46 and 45 are sandwiched together during assembly. A battery 47 is included to provide electrical power for calculator 43.

Those skilled in the art will appreciate that the system and the method of the present invention simplifies and reduces the cost of assembling and interconnecting electronic devices. Wire-bonding, including soldering operations, plastic encapsulation and trimming and forming steps, typically associated with semiconductor device assembly, packaging and interconnection, are eliminated. Because of the circular configuration of connector device 11 and the radially expanding electrical conductors formed thereon, a first set of electrical components can be effectively connected with a second set of electrical components which have a substantially different size and spacing from that of the first set of components without the need for expensive alignment equipment and the like. Further, because soldering is not necessary, cost savings are effected by forming printed circuit conductors directly on an insulative casing of an electronic apparatus, so that a separate printed circuit board component is not required.

Various embodiments of the invention have now been described in detail. Since it is obvious that many additional changes and modifications can be made to the above-described details without departing from the nature and spirit of the invention, the invention is not to be limited to these details except as set forth in the appended claims.

What is claimed is:

1. A device for electrically interconnecting first and second sets of electrical components, said first set of electrical components disposed at first equal angular intervals about a first circle and said second set of electrical components disposed at said equal first angular intervals about a second circle, said second circle having a greater radius than and concentric with said first circle, said device comprising:
   (a) a flexible media having first and second opposite major surfaces;
   (b) a plurality of electrical conductors extending radially outward from a central portion of said first major surface with insulative material interposed between said conductors, said electrical conductors disposed at equal second angular intervals, said second angular intervals less than said first angular intervals, said electrical conductors further having equal width at any given radial distance from said central portion and having increasing width in a direction radially outward from said central portion;
   (c) radially inward portions of selected ones of said conductors for being positioned in contact with respective ones of said first set of electrical components and radially outward portions of said selected ones of said conductors for being positioned in contact with respective ones of said second set of electrical components, thereby electrically interconnecting said first and second sets of components.

2. The device according to claim 1, wherein said insulative material is of the same second angular interval as said electrical conductors, the width of said insulative material also increasing in a direction radially outward from said central portion.

3. The device according to claim 1, wherein said first set of electrical components is comprised of a plurality of electrical bond pads disposed about said first circle on a major surface of a semiconductor device and spaced apart at said equal first angular intervals at a predetermined radial distance from the geometric center of the device and said second set of electrical components is comprised of a plurality of printed circuit conductors disposed about said second circle on an insulative substrate, said printed circuit conductors extending radially inward toward respective ones of said bond pads.

4. The device according to claim 1, wherein said flexible media is a circular elastomer material.

5. The device according to claim 4, wherein each of said electrical conductors is approximately 2 mils wide at a radial distance of 60 mils from the geometric center of said material.

6. A method of interconnecting first and second sets of electrical components, said first set of electrical components disposed at first equal angular intervals about a first circle and said second set of electrical components disposed at said equal first angular intervals about a second circle, said second circle having a greater radius than and concentric with said first circle, said method comprising:
   (a) providing a flexible media having a plurality of electrical conductors extending radially outward from a central portion of a major surface thereof with insulative material interposed between adjacent conductors, said electrical conductors disposed at equal second angular intervals, said second angular intervals less than said first angular intervals, said electrical conductors further having equal width at any given radial distance from said central portion and having increasing width in a direction radially outward from said central portion;
   (b) radially aligning said first set of electrical components with respective ones of said second set of electrical components; and
   (c) placing radially inward portions of selected ones of said electrical conductors in contact with respective ones of said first set of electrical components and radially outward portions of said selected ones of said electrical conductors in contact with respective ones of said second set of electrical components to electrically interconnect said first and second sets of components.

7. The method according to claim 6, wherein said step of aligning said first set of electrical components with respective ones of said second set of electrical components is comprised of positioning each of said first set of electrical components within a predetermined distance of a position at which an axis extending radially inward from a respective one of said second set of electrical components intersects said first circle, said predetermined distance being a function of the geometry and configuration of said first set of electrical components.

8. The method according to claim 6 further including the step of exerting biasing pressure on said media to maintain said media in a fixed position with respect to said first and second sets of electrical components, for effective electrical interconnection therebetween.

9. The method according to claim 6, wherein said first set of electrical components is disposed in said first circle on a major surface of an electronic device and said step of placing radially inward portions of said electrical conductors in contact with said first set of electrical components is comprised of positioning the central portion of said media in registration with the geometric center of said first circle.

10. The method according to claim 9, wherein said first set of electrical components is comprised of a plurality of bond pads disposed in said first circle on a major surface of a semiconductor chip and said second set of electrical components is comprised of a plurality of printed circuit conductors disposed about said second circle on an insulative substrate, said printed circuit conductors extending radially inward toward respective ones of said bond pads, electrical interconnection being effected between said bond pads and said printed circuit conductors by positioning the central portion of said media in registration with the geometric center of said first circle.

11. An electronic system comprising:
(a) first and second sets of electrical components, said first set of electrical components disposed at equal first angular intervals about a first circle and said second set of electrical components disposed at said equal first angular intervals about a second circle, said second circle having a greater radius than and concentric with said first circle;
(b) a flexible media having a plurality of electrical conductors extending radially outward from a central portion thereof with insulative material interposed between adjacent conductors, said electrical conductors disposed at equal second angular intervals, said second angular intervals less than said first angular intervals, said electrical conductors further having equal width at any given radial distance from said central portion and having increasing width in a direction radially outward from said central portion;
(c) radially inward portions of selected ones of said conductors being in contact with respective ones of said first set of electrical components and radially outward portions of said selected ones of said conductors being in contact with respective ones of said second set of electrical components, thereby electrically interconnecting said first and second sets of components.

12. The system according to claim 11, wherein said first set of electrical components is comprised of a plurality of electrical bond pads disposed in said first circle on a major surface of a semiconductor device and spaced apart at said equal first angular intervals at a predetermined radial distance from the geometric center of the device and said second set of electrical components is comprised of a plurality of printed circuit conductors disposed about said second circle on an insulative substrate, said printed circuit conductors extending radially inward toward respective ones of said bond pads.

13. The system according to claim 12, wherein said electrical bond pads each have a width of approximately 5 mils with a spacing of approximately 8.5 mils between adjacent bond pads and said printed circuit conductors each have a width of approximately 15 mils with a spacing of approximately 15 mils between adjacent conductors.

14. The system according to claim 12, wherein the central portion of said flexible media is positioned in registration with the geometric center of said electronic device, said media being substantially larger than said electronic device to provide a protective covering therefor.

15. The system according to claim 11, wherein each of said electrical conductors is approximately 2 mils wide at a radial distance of 60 mils from the geometric center of said elastomer material.

16. The system according to claim 11 further including means for exerting biasing pressure on said flexible media to maintain said media in a fixed position with respect to said first and said second sets of electrical components.

17. An electronic apparatus comprising:
(a) an insulative external casing for housing electrical components of said electronic apparatus having an inner major surface;
(b) an electronic device having a plurality of electrical bond pads disposed at equal first angular intervals about a first circle on a major surface thereof;
(c) a plurality of printed circuit conductors extending inwardly toward the perimeter of said device, said printed circuit conductors disposed at said equal first angular intervals about a second circle, said second circle having a greater radius than and concentric with said first circle and said printed circuit conductors being formed directly on said inner major surface of said insulative casing;
(d) at least one electrical component coupled to selected ones of said printed circuit conductors; and
(e) a flexible media having radially extending electrical conductors on a major surface thereof, said electrical conductors disposed at equal second angular intervals, said second angular intervals less than said first angular intervals, said electrical conductors further having equal width at any given radial distance from said central portion and having increasing width in a direction radially outward from said central portion, radially inward portions of selected ones of said conductors being in contact with respective ones of said bond pads and radially outward portions of said selected ones of said conductors being in contact with respective ones of said printed circuit conductors to electrically interconnect said electronic device with said at least one electrical component.

18. The apparatus according to claim 17 wherein said bond pads are disposed about said first circle on said electronic device and selected ones of said printed circuit conductors are in radial alignment with respective ones of said bond pads.

19. The apparatus according to claim 18, wherein said inner major surface has a recessed portion formed therein, said electronic device being disposed within said recessed portion so that said electrical bond pads are substantially in the same plane as said printed circuit conductors to facilitate electrical interconnection therebetween.

20. The apparatus according to claim 17, wherein said insulative casing includes biasing means affixed to an inner major surface opposite to the inner major surface on which said printed circuit conductors are formed, for exerting biasing pressure on said flexible media to maintain said media in a fixed position with respect to said bond pads and said printed circuit conductors.

21. The system according to claim 17, wherein said flexible media is comprised of a circular elastomer material having a larger area than the area of said electronic device, the central portion of said elastomer material being in registration with the geometric center of said first circle of said electronic device to provide a protective covering for said electronic device.

22. The apparatus according to claim 17, wherein said apparatus is an electronic calculator and said electronic device is an integrated circuit mounted on a single semiconductor chip, said calculator further including keyboard and display means coupled to respective ones of said printed circuit conductors, said keyboard and display means being electrically coupled to said integrated circuit by means of said flexible media.

23. An electronic apparatus comprising:
   (a) an insulative external casing for housing electrical components of said electronic apparatus having an inner major surface;
   (b) an electronic device having a plurality of electrical bond pads disposed at equal first angular intervals about a first circle on a major surface thereof;
   (c) a plurality of printed circuit conductors extending inwardly toward the perimeter of said device, said printed circuit conductors disposed at said equal first angular intervals about a second circle, said second circle having a greater radius than and concentric with said first circle and said printed circuit conductors being formed directly on said inner major surface of said insulative casing;
   (d) a flexible media having a plurality of electrical conductors disposed on a major surface thereof, said electrical conductors disposed at equal second angular intervals, said second angular intervals less than said first angular intervals, said electrical conductors further having equal width at any given radial distance from said central portion and having increasing width in a direction radially outward from said central portion, said major surface of said media being positioned in contact with said major surface of said electronic device so that corresponding first portions of said electrical conductors are in contact with said bond pads and corresponding second portions of said electrical conductors are in contact with said printed circuit conductors, thereby electrically interconnecting said electronic device with said printed circuit conductors.

24. The apparatus according to claim 23 further including at least one electrical component coupled to selected ones of said printed circuit conductors, said electronic device being coupled to said at least one electrical component by means of said selected ones of said printed circuit conductors.

25. The apparatus according to claim 24 wherein said apparatus is an electronic calculator, said electronic device being an integrated circuit mounted on a single semiconductor chip, said at least one electrical component being comprised of keyboard and display means.

* * * * *